United States Patent
Yanaka

Patent Number: 6,156,475
Date of Patent: Dec. 5, 2000

[54] IMAGE FORMING PROCESS USING SILVER HALIDE, REDUCING AGENT AND POLYMERIZABLE COMPOUND

[75] Inventor: Hiromitsu Yanaka, Haibara-gun, Japan

[73] Assignee: Fuji Photo Film Co., Ltd., Kanagawa, Japan

[21] Appl. No.: 09/459,976

[22] Filed: Dec. 14, 1999

[30] Foreign Application Priority Data

Dec. 17, 1998 [JP] Japan ................. 10-359186

[51] Int. Cl.$^7$ .................. G03C 8/08; G03C 8/401
[52] U.S. Cl. .................. 430/203; 430/202; 430/204; 430/205; 430/623; 430/627; 430/906; 430/908; 430/910; 430/619
[58] Field of Search ................. 430/627, 619, 430/623, 302, 306, 203, 202, 204, 910, 205, 908, 906

[56] References Cited

U.S. PATENT DOCUMENTS 5,882,838  3/1999  Hoshi et al. ................. 430/203
6,013,408  1/2000  Makino ................. 430/203

FOREIGN PATENT DOCUMENTS

WO 95/12495  5/1995  WIPO .

Primary Examiner—Thorl Chea
Attorney, Agent, or Firm—Sughrue, Mion, Zinn, Macpeak & Seas, PLLC

[57] ABSTRACT

An image forming process comprises the steps of imagewise exposing to light a light-sensitive material, heating the light-sensitive material to develop the silver halide within the exposed area and to harden the hardening layer, and removing the light-sensitive layer and the unhardened area of the hardening layer from the light-sensitive material with an etching solution to form a replica image of the hardened area on the support. The light-sensitive material comprises a support, a hardening layer and a light-sensitive layer in this order. The hardening layer contains an ethylenically unsaturated polymerizable compound represented by the formula (I).

$$A(-NH-CO-Y-L-Q_n)_m \qquad (I)$$

in which A is an m-valent organic group having 1 to 50 carbon atoms; Y is —O— or —NR—, wherein R is hydrogen or an alkyl group having 1 to 12 carbon atoms; L is an (n+1)-valent aliphatic group having 1 to 10 carbon atoms; Q is acryloyloxy or methacryloyloxy; n is 1, 2 or 3; and m is 2, 3, 4, 5 or 6.

12 Claims, 1 Drawing Sheet

FIGURE
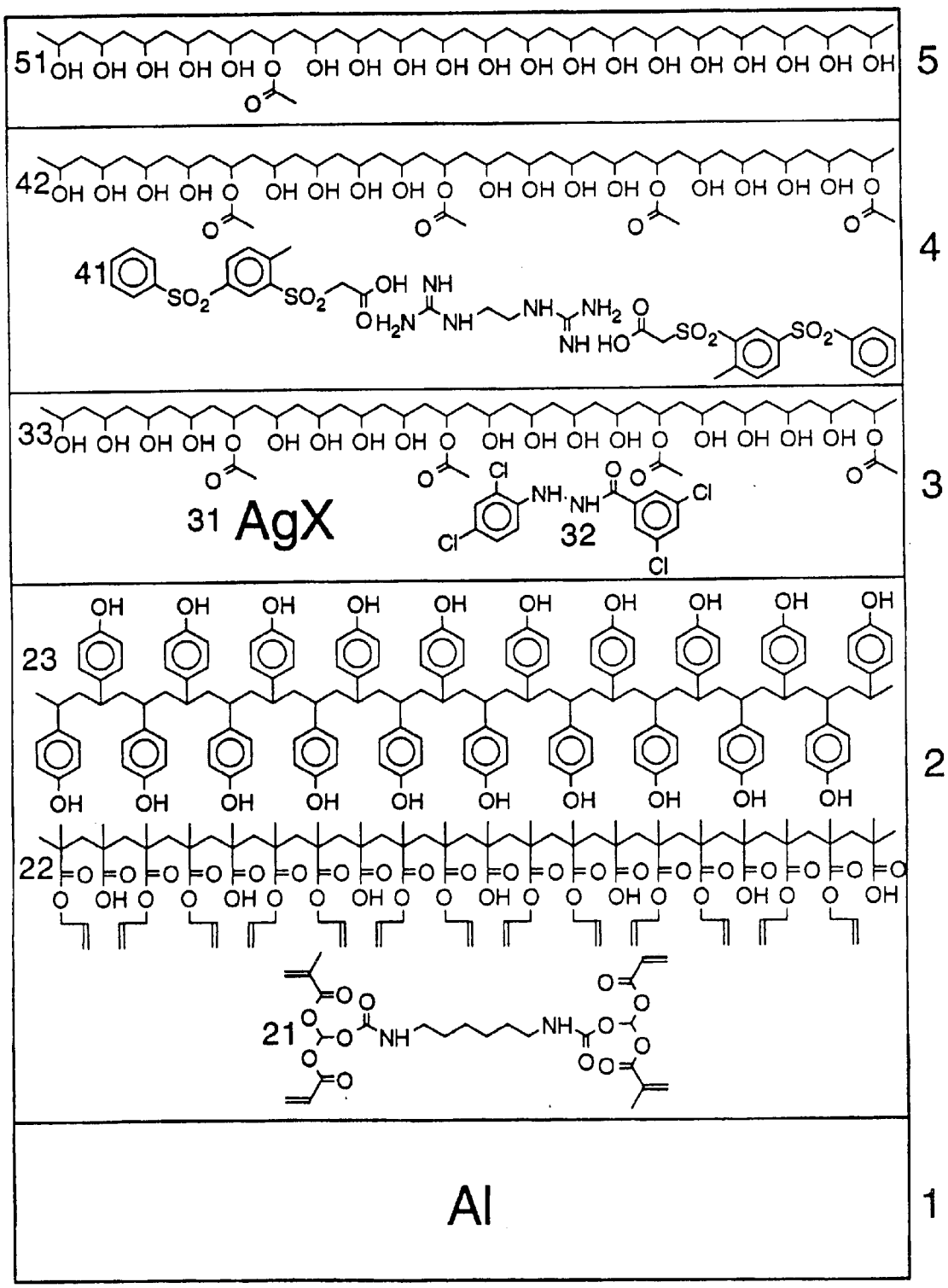

IMAGE FORMING PROCESS USING SILVER HALIDE, REDUCING AGENT AND POLYMERIZABLE COMPOUND

FIELD OF THE INVENTION

The present invention relates to an image forming process comprising the steps of imagewise exposing to light a light-sensitive material containing silver halide, heating the material to develop the silver halide within the exposed area and to harden a hardening layer, and removing the light-sensitive layer and the unhardened area of the hardening layer with an etching solution to form a replica image of the hardened area. The invention also relates to the light-sensitive material.

BACKGROUND OF THE INVENTION

U.S. Pat. No. 4,629,676 (Hayakawa et al) and European Patent No. 0174634 (Fuji Photo Film Co., Ltd.) disclose an image forming process comprising the steps of imagewise exposing to light a light-sensitive material and heating the light-sensitive material. The light-sensitive material comprises a support and a light-sensitive hardening layer containing silver halide, a reducing agent and an ethylenically unsaturated polymerizable compound. The silver halide is developed by heating the light-sensitive material to form a polymer image. The polymerization is initiated by an oxidation radical of the reducing agent (including a radical formed from an oxidation product of the reducing agent).

The image forming process can be applied for the preparation of a lithographic plate.

U.S. Pat. No. 5,122,443 (Takeda), U.S. Pat. No. 5,290,659 (Takeda) and European Patent No. 0426192 (Fuji Photo Film Co., Ltd.) disclose embodiments of the light-sensitive materials, which are advantageously used for the preparation of a lithographic plate. The light-sensitive material for the lithographic plate generally comprises a hardening layer and a light-sensitive layer provided on a support. The hardening layer contains an ethylenically unsaturated polymerizable compound. The light-sensitive layer contains silver halide. The hardening layer or the light-sensitive layer further contains a reducing agent.

The process for the preparation of a lithographic plate comprises the steps of imagewise exposing to light the light-sensitive material, heating the material to harden the polymerizable compound, removing the light-sensitive layer from the material, and removing the unhardened area of the hardening layer with an etching solution. The formed replica image is used as a printing plate. In the process, an acrylic or methacrylic ester of a polyhydric alcohol (e.g., pentaerythritol) has usually been used as the ethylenically unsaturated polymerizable compound.

SUMMARY OF THE INVENTION

The applicant has studied the process for the preparation of a lithographic plate. The applicant notes that a printed image obtained by the process often comprises dwarfish dots to cause unexpected blanks (i.e., plate wearing) at top high light areas or to degrade the reproduction of the gradation. The problem depends on the heating conditions for development and on the composition of the etching solution. Accordingly, the trouble can be reduced by optimizing those conditions. However, the heating condition and the composition of the etching solution preferably have wide latitude.

An object of the present invention is to provide a process of forming a clear image, even if the processing conditions such as the heating condition and the composition of the etching solution are changed.

Another object of the invention is to provide a light-sensitive material used for the image forming process.

The present invention provides an image forming process comprising the steps of:

imagewise exposing to light a light-sensitive material which comprises a support, a hardening layer and a light-sensitive layer in this order, said hardening layer containing an ethylenically unsaturated polymerizable compound represented by the formula (I), said light-sensitive layer containing silver halide and a hydrophilic polymer, and said hardening layer or said light-sensitive layer containing a reducing agent:

in which A is an m-valent organic group having 1 to 50 carbon atoms; Y is —O— or —NR—, wherein R is hydrogen or an alkyl group having 1 to 12 carbon atoms; L is an (n+1)-valent aliphatic group having 1 to 10 carbon atoms; Q is acryloyloxy or methacryloyloxy; n is 1, 2 or 3; and m is 2, 3, 4, 5 or 6;

heating the light-sensitive material to develop the silver halide within the exposed area and to harden the hardening layer; and removing the light-sensitive layer and the unhardened area of the hardening layer from the light-sensitive material with an etching solution to form a replica image of the hardened area on the support.

The invention also provides a light-sensitive material which comprises a support, a hardening layer and a light-sensitive layer in this order, said hardening layer containing an ethylenically unsaturated polymerizable compound represented by the formula (I), said light-sensitive layer containing silver halide and a hydrophilic polymer, and said hardening layer or said light-sensitive layer containing a reducing agent.

The applicant has found that the ethylenically unsaturated polymerizable compound having urethane linkage or urea linkage (i.e., —NH—CO—Y—) can form a clear image, regardless of variation of treatment conditions such as the heating condition for development and the composition of the etching solution.

According to the study of the inventor, the dwarfish dots of the printed image results from damages of the fringes of the dots on the printing plate. Since the fringes of the dots on the light-sensitive material are often exposed to light in a relatively small amount, they are insufficiently hardened. Accordingly, those fringes are often damaged by the etching solution, and the damaged parts cause blanks in the image. In the invention, the insufficiently hardened fringes are reinforced with the urethane or urea moiety of the polymerizable compound of the formula (I). Thereby, the damages by the etching solution are inhibited to reduce the dwarfish dots.

BRIEF DESCRIPTION OF THE DRAWINGS

FIGURE is a sectional view schematically illustrating a typical embodiment of the light-sensitive material of the invention.

DETAILED DESCRIPTION OF THE INVENTION

[Ethylenically unsaturated polymerizable compound]

The ethylenically unsaturated polymerizable compound used in the invention is represented by the formula (I).

In the formula (I), A is an m-valent organic group having 1–50 carbon atoms, preferably is an m-valent aliphatic group having 1 to 20 carbon atoms or an m-valent organic group having 1 to 50 carbon atoms consisting of a combination of an aliphatic group with —O—, —CO—, —N< or —NH—. The aliphatic group is preferably saturated, and the organic group may have a cyclic structure.

In the formula (I), m is an integer of 2 to 6, preferably is 2 to 5, more preferably is 2 to 4, and most preferably is 2 or 3.

Examples of A are shown below.

In the formula (I), Y is —O— or —NR— in which R is hydrogen or an alkyl group having 1 to 12 carbon atoms. R preferably is hydrogen. Y preferably is —O—.

In the formula (I), L is an (n+1)-valent aliphatic group having 1 to 10 carbon atoms. The aliphatic group is preferably saturated. The aliphatic group preferably has 1 to 6 carbon atoms, more preferably has 1 to 4 carbon atoms, and most preferably 1 to 3 carbon atoms.

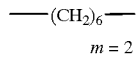

A-1

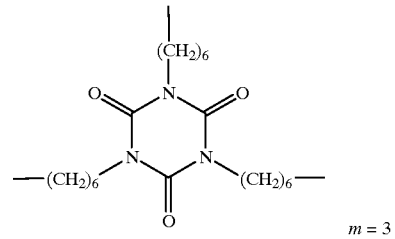

A-2

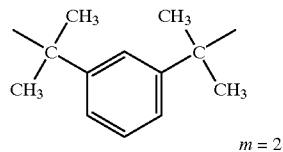

A-3

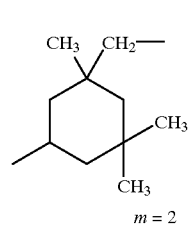

A-4

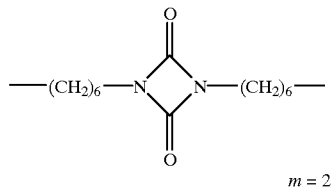

A-5

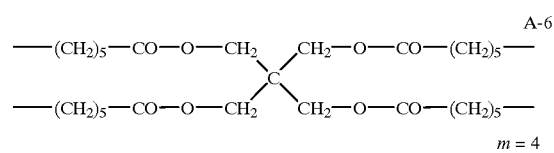

A-6

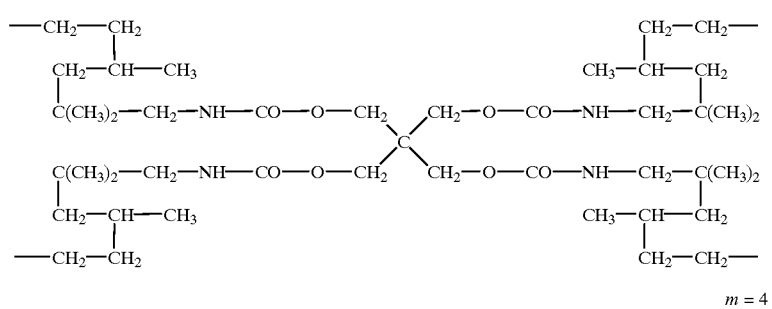

A-7

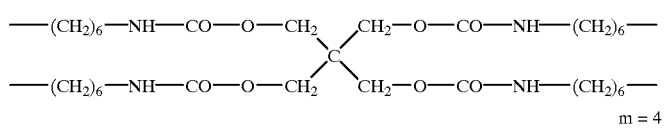

A-8

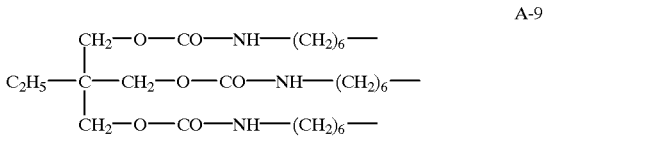

A-9

In the formula (I), n is an integer of 1 to 3, and preferably is 1 or 2.

Examples of L are shown below.

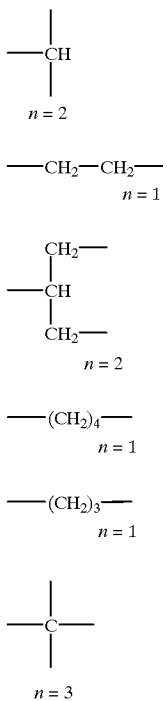

In the formula (I), Q is acryloyloxy or methacryloyloxy. The formula (I) contains a plural number (n×m: 2 to 18) of the groups of Q. Each of Q can independently be acryloyloxy or methacryloyloxy.

Two or more compounds represented by the formula (I) can be used in combination. Further, the polymerizable compound of the formula (I) can be used in combination with other ethylenically unsaturated polymerizable compounds. In that case, the compound of the formula (I) is preferably used in an amount of not less than 50 wt. %, more preferably not less than 60 wt. %, further preferably not less than 70 wt. % based on the total amount of the ethylenically unsaturated polymerizable compounds.

Examples of ethylenically unsaturated polymerizable compounds other than those of the formula (I) include acrylic acids, salts thereof, acrylic esters, acrylamides, methacrylic acids, salts thereof, methacrylic esters, methacrylamides, maleic anhydride, maleic esters, itaconic esters, styrenes, vinyl ethers, vinyl esters, N-vinyl heterocyclic compounds, allyl ethers, and allyl esters.

[Layered structure]

The light-sensitive material comprises a support, a hardening layer and a light-sensitive layer in this order. On the light-sensitive layer, an image formation accelerating layer and/or an overcoating layer can be provided. A reducing agent is added to the hardening layer or the light-sensitive layer.

The components of the above-mentioned layers are preferably uniformly dispersed in the layers without use of microcapsules.

The light-sensitive material may further have other optional layers such as an adhesive layer, a sticky layer, a strippable layer, an undercoating layer and an intermediate layer.

A preferred layered structure is described below by referring to the drawing.

FIGURE is a sectional view schematically illustrating a typical embodiment of the light-sensitive material.

The light-sensitive material shown in FIGURE comprises an aluminum support (1), a hardening layer (2), a light-sensitive layer (3), an image formation accelerating layer (4) and an overcoating layer (5) in this order. The hardening layer (2) contains an ethylenically unsaturated polymerizable compound (21), an ethylenically unsaturated crosslinkable polymer (22) and an adhesion accelerating polymer (23). The light-sensitive layer (3) contains silver halide (31), a reducing agent (32) and a hydrophilic polymer (33). The image formation accelerating layer (4) contains a base precursor (41) and a hydrophilic polymer (42). The overcoating layer (5) contains a hydrophilic polymer (51).

[Support]

The support can be made of a paper, a synthetic paper, a paper laminated with a synthetic resin (e.g., polyethylene, polypropylene, polystyrene), a plastic (e.g., polyethylene terephthalate, polycarbonate, polyimide, Nylon, cellulose triacetate) film, a metal (e.g., aluminum, aluminum alloy, zinc, iron, copper) plate or a paper or plastic film laminated with the metal. Further, the metal can be evaporated onto the paper or plastic film to form the support.

In the case that the light-sensitive material is used for the preparation of a lithographic plate, the support is preferably made of aluminum, polyethylene terephthalate, polycarbonate, paper or synthetic paper. A complex sheet can also be used as the support. For example, an aluminum sheet can be laminated on the polyethylene terephthalate film. An aluminum support is particularly preferred.

The aluminum support is preferably treated to form a rough surface (graining treatment) or a hydrophilic surface.

The treatment for the rough surface can be conducted by an electrochemical graining treatment and/or a mechanical graining treatment. According to the electrochemical graining treatment, a current passes through an aluminum plate in an electrolytic solution of hydrochloric acid or nitric acid. The mechanical graining treatment includes a wire brushing method, a ball graining method and a brash graining method. In the wire brushing method, the surface of aluminum plate is scratched with a metal wire. In the ball graining method, the surface of aluminum plate is grained with graining balls and a graining agent. In the brash graining method, the surface is grained with a Nylon brash and a graining agent.

The grained aluminum plate is then chemically etched with an alkali or an acid. An alkali etching method is industrially advantageous. Examples of the alkali agents include sodium carbonate, sodium aluminate, sodium metasilicate, sodium phosphate, sodium hydroxide, potassium hydroxide and lithium hydroxide. The alkali solution preferably has a concentration in the range of 1 to 50 wt. %. The temperature of the alkali treatment is preferably in the range of 20 to 100° C. The treatment conditions are preferably so adjusted that the amount of the dissolved aluminum is in the range of 5 to 20 g per $m^2$.

The aluminum plate is usually washed with an acid to remove smut from the surface after the alkali etching treatment. Examples of the acids include nitric acid, sulfuric acid, phosphoric acid, chromic acid, hydrofluoric acid and borofluoric acid.

The smut removing treatment can also be conducted according to a conventional method after the electrochemical graining treatment. For example, an aluminum plate can be treated with 15 to 65 wt. % sulfuric acid at a temperature in the range of 50 to 90° C.

The surface treated aluminum plate can be subjected to an anodizing treatment or a chemical treatment. The anodizing treatment can be conducted according to a conventional method. In more detail, a direct or alternative current passes through an aluminum plate in a solution of an acid to form an anodic oxide layer on the surface of the plate. Examples of the acids include sulfuric acid, phosphoric acid, chromic acid, oxalic acid, sulfamic acid and benzenesulfonic acid. The conditions of the anodizing treatment depend on the contents of the electrolytic solution. The concentration of the electrolytic solution is preferably in the range of 1 to 80 wt. %, the temperature of the solution is preferably in the range of 5 to 70° C., the current density is preferably in the range of 0.5 to 60 A/dm$^2$, the voltage is preferably in the range of 1 to 100 v, and the time for the electrolysis is preferably in the range of 10 to 100 seconds.

The anodizing treatment is preferably conducted in sulfuric acid at a high current density. Phosphoric acid is also preferably used for the anodizing treatment.

After the anodizing treatment, the aluminum plate can be treated with an alkali metal silicate. For example, the aluminum plate can be immersed in an aqueous solution of sodium silicate. An undercoating layer can be provided on the aluminum support to improve the adhesion between the support and the hardening layer or to improve a printing character.

[Undercoating layer]

An undercoating layer (hydrophilic layer) can be provided on not only the above-mentioned aluminum support, but also a support having a hydrophobic (or not sufficiently hydrophilic) surface (e.g., a polymer film).

Examples of the components of the undercoating layer include a polymer (e.g., gelatin, casein, polyvinyl alcohol, ethyl cellulose, phenol resin, styrene-maleic anhydride resin, polyacrylic acid), an amine (e.g., monoethanol amine, diethanol amine, triethanol amine, tripropanol amine) and a salt thereof (e.g., chloride, oxalate, phosphate), an monoaminomonocarboxylic acid (e.g., aminoacetic acid, alanine), an oxyamino acid (e.g., serine, threonine, dihydroxyethylglycine), a sulfur-containing amino acid (e.g., cysteine, cystine), a monoaminodicarboxylic acid (e.g., aspartic acid, glutamic acid), a diaminomonocarboxylic acid (e.g., lysine), an aromatic amino acid (e.g., p-hydroxylphenylglycine, phenylalanine, anthranilic acid), an aliphatic aminosulfonic acid (e.g., sulfamic acid, cyclohexylsulfamic acid) and a (poly)aminopolyacetic acid (e.g., ethylenediaminetetraacetic acid, nitrilotriacetic acid, iminodiacetic acid, hydroxyethyliminodiacetic acid, hydroxyethylethylenediamineacetic acid, ethylenediaminediacetic acid, cycloethylenediaminetetraacetic acid, diethylenetriaminepentaaceitic acid, glycoletherdiaminetetraacetic acid). All or a part of the acidic groups of the above-mentioned compound may form a salt (e.g., sodium salt, potassium salt, ammonium salt). Two or more components can be used in combination.

In the case that a polymer film is used as a support, hydrophilic fine particles (e.g., silica particles) are preferably added to a hydrophilic undercoating layer in place of the graining treatment of an aluminum support.

[Hardening layer]

The hardening layer contains the aforementioned ethylenically unsaturated polymerizable compound. Preferably, the layer further contains a hydrophobic polymer. More preferably, the layer furthermore contains an adhesion accelerating polymer.

The amount of the hydrophobic polymer is preferably in the range of 30 to 95 wt. %, and more preferably in the range of 50 to 90 wt. % based on the total weight of the hardening layer.

The amount of the ethylenically unsaturated polymerizable compound is preferably in the range of 3 to 200 wt. %, and more preferably in the range of 10 to 100 wt. % based on the amount of the hydrophobic polymer.

The hardening layer preferably has a thickness in the range of 0.1 to 20 μm, and more preferably in the range of 0.3 to 7 μm.

[Light-sensitive layer]

The light-sensitive layer contains silver halide and a hydrophilic polymer.

The coating amount of silver halide is preferably in the range of 0.01 to 5 g per m$^2$, more preferably in the range of 0.03 to 1 g per m$^2$, and most preferably in the range of 0.05 to 0.3 g per m$^2$, in terms of silver amount.

The light-sensitive layer preferably has a thickness in the range of 0.07 to 13 μm, and more preferably in the range of 0.2 to 5 μm.

[Overcoating layer and image formation accelerating layer]

An overcoating layer has a function of preventing oxygen in the air from permeating into the hardening layer. Oxygen functions as a polymerization inhibitor. The overcoating layer can function as a protective layer. The overcoating layer can also function as an image formation accelerating layer, which contains a component (e.g., a base, a base precursor, a reducing agent, a heat development accelerator) that accelerates an image forming reaction. The overcoating layer and the image formation accelerating layer can be separately provided. In that case, the overcoating layer is formed on the image formation accelerating layer.

The overcoating layer or the image formation accelerating layer preferably has a thickness in the range of 0.3 to 20 μm, more preferably in the range of 0.5 to 7 μm.

[Intermediate layer]

An intermediate layer can be provided between the layers.

The intermediate layer can function as an antihalation layer, a filter layer or a barrier layer. The antihalation layer and the filter layer are functional layers containing dyes. The barrier layer prevents components from moving between layers when the light-sensitive material is stored. The composition of the intermediate layer is determined according to its function.

The intermediate layer preferably has a thickness of not more than 10 μm.

[Silver halide]

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. Irregular forms and mixed forms as well as the above mentioned regular forms can be used in the silver halide emulsions. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 μm. The grains may also be relatively large grains having a diameter of more 10 μm. A monodispersed emulsion is preferred to a polydispersed emulsion. The monodispersed emulsion is described in U.S. Pat. Nos. 3,574,628, 3,655,394 and British Patent No. 1,413,748.

With respect to the crystal structure of the silver halide grains, the individual grains have a homogeneous halogen composition or a heterogeneous halogen composition. In the heterogeneous composition, the composition varies from the outer surface portion to the inside portion. The grains may have a multi-layered structure. Further, the silver halide grains may be conjugated with other silver halide grains having different halogen composition through epitaxial conjugation. The grains may be conjugated with compounds other than the silver halide such as silver rhodanate and lead oxide.

Various substances in the form of salt can be added to the silver halide grains. Examples of the substances include copper, thallium, lead, bismuth, cadmium, zinc, chalcogens (e.g., sulfur, selenium, tellurium), gold, and noble metals of group VIII (e.g., rhodium, iridium, iron, platinum, palladium). The salts are added to the emulsion at the grain formation or after the grain formation according to a conventional process. The conventional process is described in U.S. Pat. Nos. 1,195,432, 1,951,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound to a silver halide emulsion. Examples of water-soluble iridium compounds include hexachloroiridic (III) salts and hexachloroiridic (IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17643, pages 22 to 23 (December 1978), (Emulsion preparation and types); and Research Disclosure, No. 18716, page 648, (November 1979).

The silver halide emulsion is generally subjected to a chemical sensitization after a physical ripening. The silver halide grains preferably have a low fogging value.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

The spectral sensitizing dyes can be used to adjust the spectral sensitivity of the light-sensitive material to wavelength of two or more light sources such as various laser beams (e.g., semiconductor laser, helium neon laser, argon ion laser, helium cadmium laser, YAG laser) and a light emission diode. For example, two or more sensitizing dyes are used for silver halide grains in a light-sensitive layer so that a light-sensitive material can be exposed to two or more light sources.

A supersensitizer can be added to the emulsion in addition to the sensitizing dye. The supersensitizer itself has neither a spectral sensitization effect nor an absorption of visible light, but shows a supersensitizing effect on the sensitizing dye.

The spectral sensitizing dyes are described in Research Disclosure No. 17643 (December 1978), pages 23 to 24. The supersensitizers are described in Research Disclosure No. 18716 (November 1979), page 649.

[Organic metallic salt]

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, and azaindenes. An aliphatic, aromatic or heterocyclic compound having a mercapto group can also be used as the organic moiety. Further, silver carboxylates and acetylene silver can be used as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide.

[Reducing agent]

The reducing agent has a function of reducing the silver halide or a function of accelerating a hardening reaction of a polymerizable compound or a cross-linkable polymer.

Examples of the reducing agents include hydrazines, hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles and α-sulfonamidoketones.

The reducing agents (including compounds referred to as developing agent or hydrazine derivative) are described in Japanese Patent Provisional Publication Nos. 61(1986)-183640, 61(1986)-188535, 61(1986)-228441, 62(1987)-70836, 62(1987)-86354, 62(1987)-86355, 62(1987)-206540, 62(1987)- 264041, 62(1987)-109437, 63(1988)-254442, 1(1989)-267536, 2(1990)-141756, 2(1990)-141757, 2(1990)-207254, 2(1990)-262662 and 2(1990)-269352. The reducing agents are also described in T. James, The Theory of the Photographic Process, 4th edition, pages 291 to 334 (1977); Research Disclosure, Vol. 170, No. 17029, pages 9 to 15 (June 1978); and Research Disclosure, Vol. 176, No. 17643, pages 22 to 31 (December 1978). Further, a reducing agent precursor can be used as the reducing agent. The precursor (described in Japanese Patent Provisional Publication No. 62(1987)-210446) can release a reducing agent under heating or in contact with a base.

When the reducing agent is basic, that is, it forms a salt with an acid, the reducing agent can be used in the form of a salt with an acid.

The reducing agents can be used singly or in combination.

Certain interactions between those reducing agents may be expected where two or more reducing agents are used in combination. One of the interactions is for an acceleration of reduction of silver halide (or an organic silver salt) through so-called superadditivity. Another interaction is for a chain reaction between an oxidant of one reducing agent formed by a reduction of silver halide (or an organic silver salt) and another reducing agent through the oxidation-reduction reaction. The chain reaction induces (or inhibits) the polymerization of the polymerizable compound.

The reducing agent is used in an amount of 0.1 to 10 mol, and more preferably 0.25 to 2.5 mol based on 1 mol of silver halide.

[Antifogging agent, silver development accelerator, stabilizer]

The light-sensitive material can contain an antifogging agent, a silver development accelerator or a stabilizer. Examples of these compounds include mercapto compounds (described in Japanese Patent Provisional Publication No. 59(1984)-111636), azoles or azaindenes (described in Research Disclosure No. 17643 (1978), pages 24 to 25), nitrogen-containing carboxylic acids or phosphoric acids (described in Japanese Patent Provisional Publication No. 59(1984)-168442), cyclic amides (described in Japanese Patent Provisional Publication No. 61(1986)-151841), thioethers (described in Japanese Patent Provisional Publication No. 62(1987)-151842), polyethylene glycol derivatives (described in Japanese Patent Provisional Publication No. 62(1987)-151843), thiol (described in Japanese Patent Provisional Publication No. 62(1987)-151844), acetylene compounds (described in Japanese Patent Provisional Publication No. 62(1987)-87957) and sulfonamides (described in Japanese Patent Provisional Publication No. 61(1987)-178232).

An aromatic (a carbon or heterocyclic ring) mercapto compound (described in Japanese Patent Provisional Publication No. 6(1994)-313967) can also be used as an antifogging agent or a silver development accelerator. An aromatic heterocyclic mercapto compound, particularly a mercapto triazole derivative is preferred. The mercapto compound can be used in the form of a mercapto silver (silver salt).

These compounds are used in an amount of 107 to 1 mol based on 1 mol of the silver halide.

[Hydrophilic polymer]

A hydrophilic polymer is used as a binder of a light-sensitive layer and other hydrophilic layers, such as an adhesive layer, an overcoating layer and an intermediate layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido, amido and alkylamino. Examples of the hydrophilic bond include urethane bond, ether bond and amido bond.

Natural or synthetic polymers can be used as the hydrophilic binder. The hydrophilic polymers are described in Japanese Patent Provisional Publication No. 5(1993)-249667.

Polyvinyl alcohol is a particularly preferred hydrophilic polymer. Polyvinyl alcohol preferably has a high saponification degree of not lower than 70%, more preferably of not lower than 80%. The polyvinyl alcohol having the high saponification degree has a very low transmission coefficient of oxygen.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, vinyl higher carboxylate, a higher alkyl vinyl ether, methyl methacrylate and acrylamide.

Polyvinyl alcohol may also be denatured after the saponification. Hydroxyl in polyvinyl alcohol can be modified by etheration, esterification or acetylation.

A cross-linked polyvinyl alcohol can also be used. Examples of the cross-linking agents include aldehydes, methylol compounds, epoxy compounds, diisocyanates, divinyl compounds, dicarboxylic acids and inorganic cross-linking agents (e.g., boric acids).

The molecular weight of the hydrophilic polymer is preferably in the range of 3,000 to 500,000.

[Hydrophobic polymer]

The hardening layer preferably contains an ethylenically unsaturated cross-linkable polymer, which has a cross-linkable functional group. The cross-linkable functional group can be introduced into the main chain or side chain of the polymer molecule. The cross-linkable functional group can also be introduced into the polymer by copolymerization.

Examples of the polymer having an ethylenically unsaturated bond in its main chain include poly-1,4-butadiene, poly-1,4-isoprene and natural or synthetic rubbers. Examples of the polymer having an ethylenically unsaturated bond in its side chain include polymers of acrylic or methacrylic ester or amide having a specific residue, which means R of —COOR (ester) or —CONHR (amide). Examples of the specific residues include —(CH$_2$)$_n$—CR$^1$=CR$^2$R$^3$, —(CH$_2$O)$_n$—CH$_2$CR$^1$=CR$^2$R$^3$, —(CH$_2$CH$_2$O)$_n$—CH$_2$CR$^1$=CR$^2$R$^3$, —(CH$_2$)$_n$—NH—CO—O—CH$_2$CR$^1$=CR$^2$R$^3$, —(CH$_2$)$_n$—O—CO—CR$^1$=CR$^2$R$^3$ and —(CH$_2$CH$_2$O)$_n$—X. In the formulas, each of R$^1$, R$^2$ and R$^3$ independently is hydrogen, a halogen atom, an alkyl group, an aryl group, an alkoxy group and aryloxy group. The number of the carbon atoms contained in R$^1$, R$^2$ or R$^3$ is not more than 20. R$^1$ and R$^2$ or R$^3$ may be combined to form a ring. In the formulas, n is an integer of 1 to 10. X is dicyclopentadienyl.

Examples of the ester residues include —CH$_2$CH=CH$_2$ (described in Japanese Patent Publication No. 7(1995)-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NHCOO—CH$_2$CH=CH$_2$ and —CH$_2$CH$_2$O—X (wherein X is dicyclopentadienyl). Examples of the amide residues include —CH$_2$CH=CH$_2$, —CH$_2$CH$_2$-1-Y (wherein Y is cyclohexene) and —CH$_2$CH$_2$—OCO—CH=CH$_2$.

The cross-linkable polymer is hardened by adding a free radical to the unsaturated bond (or group). The free radical functions as a polymerization initiator or a chain extender. The polymers are cross-linked with each other directly or by a chain reaction of a polymerizable compound. The polymer can also be cross-linked by a reaction of polymer radicals, which are formed by detaching an atom of the polymers (e.g., hydrogen attached to carbon adjacent to the unsaturated bond) by a free radical.

A non-cross-linkable (or weak cross-linkable) hydrophobic polymer can be used as a binder of a hardening layer together with the cross-linkable polymer. Examples of the non-cross-linkable hydrophobic polymers include polyacrylic esters, polymethacrylic esters (e.g., polymethyl methacrylate, polybenzyl methacrylate), polyacrylamides and polymethacrylamides. These polymers have a saturated aliphatic residue or an aromatic residue in place of the above-mentioned ethylenically unsaturated residue (R).

Other examples of non-cross-linkable polymers include polyvinyl acetate, polyvinyl chloride, polyvinylidene chloride, polyacrylonitrile, polymethacrylonitrile, polyethylene, polyvinyl pyridine, polyvinyl imidazole, polyvinyl butyral, polyvinyl formal, polyvinyl pyrrolidone, chlorinated polyethylene, chlorinated polypropylene, polyesters, polyamides, polyurethanes, polycarbonates, cellulose ether (e.g., ethyl cellulose) and cellulose esters (e.g., triacetyl cellulose, diacetyl cellulose, cellulose acetate butyrate).

The above-mentioned hydrophobic (cross-linkable or non-cross-linkable) polymer preferably has an acidic group.

Examples of the acidic functional groups include carboxyl, an acid anhydride group, phenolic hydroxyl, sulfo, sulfonamido and sulfonimido. Carboxyl is preferred. The acidic functional groups can be introduced into the polymer by copolymerization with an acidic monomer. Examples of the acidic monomers include acrylic acid, methacrylic acid, styrenesulfonic acid and maleic anhydride. The amount of the monomer having the acidic functional group in the copolymer is preferably in the range of 1 to 60 mol %, more preferably in the range of 5 to 50 mol %, and most preferably in the range of 10 to 40 mol %.

The molecular weight of the hydrophobic polymer is preferably in the range of 1,000 to 500,000. Two or more polymers may be used in combination.

[Adhesion increasing polymer]

The hardening layer preferably contains an adhesion increasing polymer to enhance the adhesion between the hardening layer and the light-sensitive layer. Examples of the adhesion increasing polymer include poly-p-hydroxystyrene and a polymer having an aromatic carboxylic acidic group. Poly-p-hydroxystyrene is preferably contained in an amount of 5 to 70 wt. % based on the total amount of the polymers in the hardening layer. The polymer having an aromatic carboxylic acidic group is preferably contained in an amount of 20 to 90 wt. % based on the total amount of the polymers in the hardening layer.

In place of using the adhesion increasing polymer, the hardening layer can be subjected to corona discharge treatment in an amount of 5 to 100 W/m²/minute or glow discharge treatment in an amount of 1 to 40 W/m²/minute, so as to enhance the adhesion to the light-sensitive layer.

[Base or base precursor]

The light-sensitive material preferably contains a base or base precursor.

Various organic or inorganic bases and their precursors (e.g., decarboxylation type, thermal decomposition type, reaction type, complex salt-formation type, dissociation type) can be used in the light-sensitive material. A base precursor is preferred to a base in view of stability of the light-sensitive material.

An example of the decarboxylation type base precursor is a salt of an organic acid with a base that is decarboxylated under heating (described in Japanese Patent Provisional Publication Nos. 59(1984)-180537, 61(1986)-313431, 63(1988)-316760, 64(1989)-68746). An example of the thermal decomposition type base precursor is a urea compound (described in Japanese Patent Provisional Publication No. 63(1988)-96159). An example of the reaction type base precursor is a transition metal acetylide (described in Japanese Patent Provisional Publication No. 63(1998)-25208). An example of the complex salt-formation type base precursor is a water-insoluble basic metal compound (described in Japanese Patent Provisional Publication No. 1(1989)-3282). An example of the dissociation type base precursor is an alkali metal salt of an organic acid (e.g., sodium acetate, sodium salt of a polymer having an acidic group).

The base precursor preferably releases a base at a temperature in the range of 50 to 200° C., and more preferably in the range of 80 to 160° C.

The base or the base precursor is preferably used in an amount of preferably 0.1 to 20 mol, and more preferably 0.2 to 10 mol based on 1 mol of silver halide.

[Heat development accelerator]

The light-sensitive material can contain a heat development accelerator. The heat development accelerator may be added to any layers of the light-sensitive material. The heat development accelerator has a function of increasing the plasticity of a polymer (contained in the hardening layer or the light-sensitive layer). The accelerator has another function of accelerating the dispersion of the components in the layers when it is melted by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296.

Examples of the heat development accelerators include polyethers (e.g., polyethylene glycol, polypropylene glycol), polyhydric alcohols (e.g., glycerol, hexanediol), saccharides (e.g., sorbitol), formic esters, ureas (e.g., urea, diethylurea, ethyleneurea), amides (e.g., acetamide, propionamide, malonamide), sulfonamides, urea resins and phenol resins. Two or more heat development accelerators can be used in combination. The heat development accelerators can be added to two or more layers of the light-sensitive material.

The amount of the heat development accelerator is preferably in the range of 0.05 to 2 g/m², and more preferably in the range of 0.1 to 1 g/m².

[Colorant]

The light-sensitive material can contain a colorant. The colorant can function as an antihalation or antiirradiation dye. Further, a hardened image can be colored with the colorant. The sensitivity can be also controlled with the colorant. Various known dyes and pigments can be used as the colorant provided that the colorant does not affect the sensitivity and the developing reaction of silver halide.

The hue of the antihalation or antiirradiation dye is preferably adjusted within the sensitive light region of silver halide. If fine particles are contained in the light-sensitive layer, they are liable to scatter light. In that case, an antiirradiation colorant is preferably added to the light-sensitive layer.

The colorants (dyes, pigments, colloidal silvers) are described in various publications such as Japanese Patent Provisional Publication No. 5(1993)-249667, Handbook of Color Index and New Handbook of Pigments, Nippon Ganryo Gijutsu Kyokai (1970). The antiirradiation dyes having little effects on the sensitivity of silver halide are described in Japanese Patent Publication Nos. 41(1966)-20389, 43(1968)-3504, 43(1968)-13168, Japanese Provisional Publication No. 2(1990)-39042, U.S. Pat. Nos. 3,423, 207, 3,697,037, and British Patent Nos. 1,030,392, 1,100, 546.

The amount of the colorant is usually in the range of 0.01 to 2 g/m², and preferably in the range of 0.05 to 1 g/m².

[Development stopping agent]

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development.

Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agents are described in Japanese Patent Provisional Publication Nos. 62(1987)-253159, 2(1990)-42447 and 2(1990)-262661.

[Surface active agent]

A surface active agent can be added to a layer of the light-sensitive material. Various nonionic, anionic, cationic or fluorine surface active agents can be used. The surface active agent is described in Japanese Patent Provisional Publication No. 2(1990)-195356. Sorbitan, polyoxyethylene and a fluorine-containing compound are preferred.

[Matting agent]

A matting agent can be added to a back layer or an overcoating layer to prevent adhesion between two light-sensitive materials when the materials are superposed.

Inorganic or organic solid particles dispersible in the hydrophilic polymer can be used as the matting agent. Examples of the matting agents include oxides (e.g., silicon dioxide), alkaline earth metal salts, natural polymers (e.g., starch, cellulose) and synthetic polymers.

The average particle size of the matting agent is preferably in the range of 0.5 to 50 Wm. The amount of the matting agent is preferably in the range of 0.1 to 1 g/m$^2$.

[Polymerization inhibitor]

A polymerization inhibitor can be added to the polymerizable layer to prevent a polymerization reaction while storing the light-sensitive material. Examples of the polymerization inhibitors include nitrosoamines, ureas, thioureas, thioamides, phenols and amines.

[Exposing step]

The silver halide light-sensitive is imagewise exposed to light.

The wavelength of the light corresponds to the spectral sensitivity of silver halide. The wavelength is usually within the visible, near ultraviolet and near infrared regions. A X-ray and an electron bean can also be used as the light.

Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser, YAG laser), light emitting diode and cathode-ray tube.

The amount of the exposure is usually in the range of 0.001 to 1,000 µJ/cm$^2$, and preferably in the range of 0.01 to 100 µJ/cm$^2$. The light-sensitive material can be exposed to light through a transparent support.

The exposure of silver halide, namely formation of latent image is influenced with the temperature and humidity at the exposing step. Accordingly, the sensitivity depends on the temperature and humidity. Therefore, the temperature and the humidity under the circumstances of the light source and the light-sensitive material are preferably controlled at constant values. An image recording apparatus having a controlling device is disclosed in Japanese Patent Provisional Publication Nos. 3(1991)-63143 and 3(1991)-63637.

[Developing step]

The light-sensitive material is heated to develop the silver halide.

The heat development can be conducted by placing the light-sensitive material on a heated material (e.g., metal plate, metal roller). The light-sensitive material may be immersed in a heated liquid for the development. Further, the light-sensitive material may be irradiated with an infrared ray.

The surface of the light-sensitive material may be open to the air while heating the material from the side of the support. The surface of the light-sensitive material may be covered with the heating means to prevent the air from penetrating into the layers. In the case that the surface is open to the air, a surface layer (such as the overcoating layer) of the light-sensitive material preferably contains a polymer having a function of prevent the air from penetrating into the layers.

The heating temperature is preferably in the range of 60 to 200° C., and more preferably in the range of 100 to 160° C. The heating time is preferably in the range of 1 to 180 seconds, and more preferably in the range of 5 to 60 seconds.

A preheat treatment or post-heat treatment can be conducted before or after the heat development, respectively. The temperature of the preheat is lower than the heat development temperature, and the time is shorter than the development time. The post-heat treatment can be conducted after the image is formed, for example after removing the unhardened hardening layer.

[Removing step]

The unhardened area can be selectively removed to form a polymer image based on a difference in the solubility between the hardened area and the unhardened area. Before the removing step, hydrophilic layers such as the light-sensitive layer and the adhesive layer are preferably removed from the light-sensitive material by mechanical peeling or washing.

The light-sensitive material can be immersed in a solvent (an etching solution) to conduct the removing step. An alkaline solution is preferably used as the solvent.

Examples of the alkaline compound include sodium hydroxide, potassium hydroxide, sodium carbonate, sodium silicate, potassium silicate, sodium metasilicate, potassium metasilicate, sodium phosphate, potassium phosphate, ammonia and aminoalcohols (e.g., monoethanolamine, diethanolamine, triethanolamine).

The solvent preferably is water. An organic solvent can be used in combination with water. An alcohol and an ether are preferably used as the organic solvent. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols (e.g., monoethanolamine, diethanolamine, triethanolamine). Examples of the ethers include cellosolves.

The solvent may further contain the other additives such as a surface active agent and a defoaming agent.

[Use of silver halide light-sensitive material]

The silver halide light-sensitive material can be used to prepare a hard copy, a relief image or a printing plate. The light-sensitive material of the present invention is advantageously used for the preparation of a printing plate.

EXAMPLE 1

Preparation of aluminum support

A surface of an aluminum plate (according to JIS-A-1050) having the thickness of 0.24 mm was ground using a nylon brush and an aqueous suspension of pumice stone of 400 mesh. The plate was well washed out with water. The aluminum plate was then immersed for etching in 10% aqueous solution of sodium hydroxide at 70° C. for 60 seconds. The plate was washed out with running water, then neutralized with 20% aqueous solution of nitric acid and washed out with water.

The obtained aluminum plate was subjected to an electrolytic surface-roughening treatment in 1% aqueous solution of nitric acid containing 0.5% aluminum nitrate in an anodically electric amount of 160 coulomb/dm$^2$ using sine wave alternating-corrugated current under such conditions as an anodic voltage of 12.7 V and a cathodically electric amount ratio to an anodically electric amount of 0.9. The center line average height (Ra) of the aluminum plate was 0.6 μm.

The aluminum plate was immersed in 1% aqueous solution of sodium hydroxide at 40° C. for 30 seconds. The plate was then immersed in 30% sulfuric acid at 55° C. for 1 minute. Further, the plate was subjected to anodizing treatment in 20% aqueous solution of sulfuric acid at a current density of 2 A/dm² to form an anodic oxide layer having the thickness of 2.5 g/dm². The plate was washed with water and dried to obtain an aluminum support.

Preparation of pigment dispersion

The following pigment dispersion was prepared.

| Pigment dispersion | |
|---|---|
| Copper phthalocyanine | 15 g |
| Allyl methacrylate/methacrylic acid copolymer (copolymerization ratio = 80/20) | 30 g |
| Methyl ethyl ketone | 55 g |

Formation of hardening layer

The following coating solution was coated and dried on the support to form a hardening layer having the dry thickness of 1.8 μm

| Coating solution of hardening layer | |
|---|---|
| The following ethylenically unsaturated polymerizable compound (a) | 2.0 g |
| Poly-p-hydroxystyrene | 1.8 g |
| The following bisphenol compound | 0.31 g |
| Propylene glycol monomethyl ether | 36.0 g |
| The above pigment dispersion | 13.0 g |

Ethylenically unsaturated polymerizable compound (a)

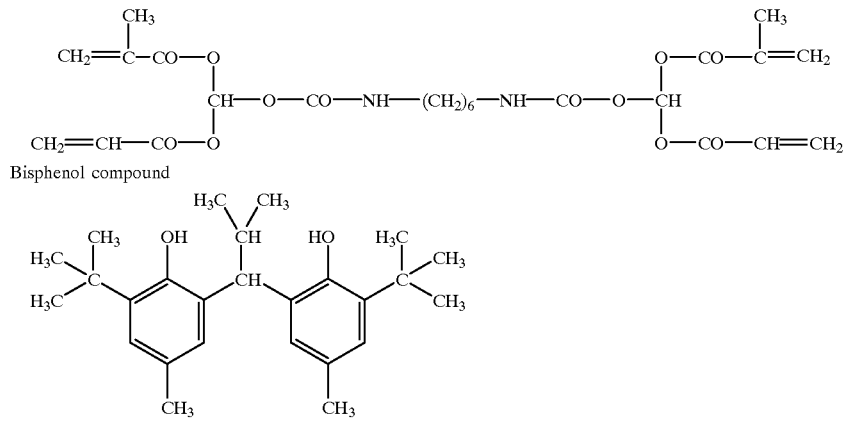

Bisphenol compound

Preparation of silver halide emulsion

Gelatin, potassium bromide and water were placed in a vessel and adjusted with sodium hydroxide to pH 9.5 at the room temperature. After the mixture in the vessel was heated to 55° C., the following thioether compound (2.0 ×10⁻³ mol based on the total amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate is 4×10⁻⁸ mol) were added to the vessel according to a pAg controlled double jet method while keeping the pAg of 9.0 in the reaction vessel to prepare a silver iodobromide emulsion. The emulsion was adjusted to pH 6.0 by using sulfuric acid. Further, a potassium bromide solution containing hexachloroiridate (III) salt (the molar ratio of iridium to silver is 5×10⁻⁷ mol) was twice added to the emulsion at 55° C. and pAg 8.6 according to a double jet method to obtain a core/shell type silver iodobromide emulsion having the following composition.

(Thioether compound)

Core: Silver iodobromide (silver iodide content: 8.5 mol %)
Shell: Pure silver bromide
Core/shell: 3/7 (molar ratio of silver)
Average silver iodide content: 2.55 mol %
Average grain size: 0.30 μm The grains of the obtained emulsion were monodispersed. In the emulsion, 98% of the grains had a grain size within the range of the average grain size ±40%.

After the emulsion was desalted, the values of pH and pAg were adjusted to 6.5 and 9.0, respectively. While the emulsion was kept at 50° C., a methanol solution of the following sensitizing dyes A and B (A:B=2:1, total amount: 8×10⁻⁴ mol per 1 mol of silver halide) was added to the emulsion. The emulsion was left for 20 minutes. To the emulsion, the following sodium salt of a thiol compound (6×10⁻⁴ mol per 1 mol of silver halide) was added. The emulsion was stirred for 5 minutes to prepare a silver halide emulsion.

Sensitizing dye A

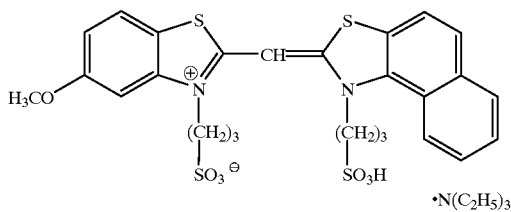

Sensitizing dye B

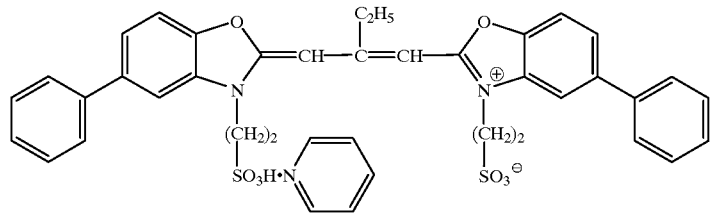

Sodium salt of thiol

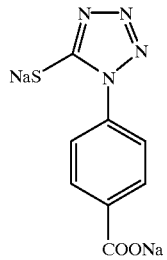

Preparation of reducing agent dispersion

In 90 g of 10 wt. % aqueous solution of polyvinyl alcohol (Kuraray Co., Ltd.), 10 g of powder of the following reducing agent was dispersed by using a dynomill dispersing device. The particle size of the reducing agent was not larger than about 0.5 μm.

Reducing agent

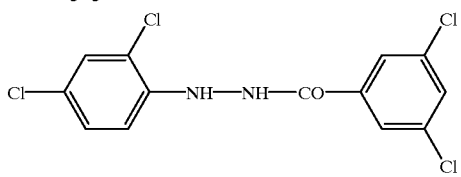

Formation of light-sensitive layer

The following coating solution was coated and dried on the hardening layer to form a light-sensitive layer having the dry thickness of 1.3 μm

| Coating solution of light-sensitive layer | |
|---|---|
| 10 Wt. % aqueous solution of polyvinyl alcohol having the saponification degree of 79.5% (PVA-405, Kuraray Co., Ltd.) | 10.5 g |
| 0.11 Wt. % methanol solution of the following compound (S-1) | 0.41 g |
| 0.11 Wt. % aqueous solution of the following compound (S-2) | 0.41 g |
| The above silver halide emulsion | 0.50 g |

| -continued | |
|---|---|
| Coating solution of light-sensitive layer | |
| 5 Wt. % aqueous solution of the above surface active agent | 0.40 g |
| The above reducing agent dispersion | 1.20 g |
| Water | 7.30 g |

(S-1)

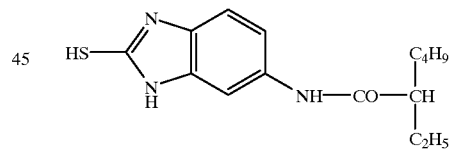

(S-2)

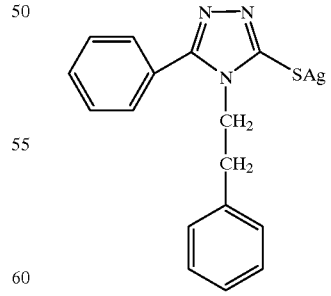

Preparation of base precursor dispersion

In 750 g of 3 wt. % aqueous solution of polyvinyl alcohol (Kuraray Co., Ltd.), 250 g of powder of the following base precursor was dispersed by using Dynomill dispersing device. The particle size of the base precursor was not larger than about 0.5 µm.

Base precursor

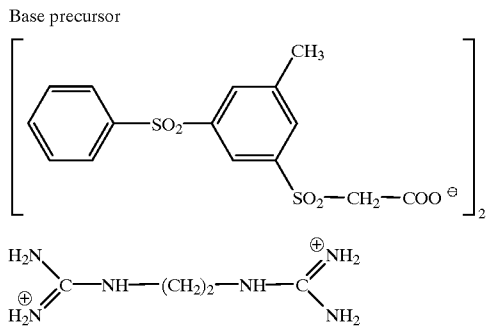

Formation of image formation accelerating layer

The following coating solution was coated and dried on the light-sensitive layer to form an image formation accelerating layer having the dry thickness of 1.3 µm.

| Coating solution of image formation accelerating layer | |
| --- | --- |
| 10 Wt. % aqueous solution of polyvinyl alcohol having the saponification degree of 79.5% (PVA-405, Kuraray Co., Ltd.) | 10.0 g |
| The base precursor dispersion | 1.1 g |
| 5 Wt. % aqueous solution of the above surface active agent | 0.3 g |

Formation of overcoating layer

The following coating solution was coated and dried on the image formation accelerating layer to form an overcoating layer having the dry thickness of 2.0 µm.

| Coating solution of overcoating layer | |
| --- | --- |
| 10 Wt. % aqueous solution of polyvinyl alcohol having the saponification degree of 95.5% (PVA-105, Kuraray Co., Ltd.) | 100.0 g |
| 5 Wt. % aqueous solution of the above surface active agent | 7.0 g |
| Glycerol | 1.2 g |

Preparation of alkaline solution

The following alkaline solution was prepared and adjusted to pH 13.5.

| Alkaline solution | |
| --- | --- |
| 28 Wt. % aqueous solution of potassium silicate | 125.0 g |
| Potassium hydroxide | 15.0 g |
| Water | 750.0 g |

Image formation

The silver halide light-sensitive material was exposed to light of 670 nm through a sharp cut interference filter. The light source was a xenon flush lump. The light emission time was $10^{-4}$ second. The exposure (energy on the surface) was 2 µJ per $cm^2$.

The aluminum support of the light-sensitive material was placed on a hot plate. The material was conveyed on the plate to heat the material at 155° C. for 30 seconds. Thus, the light-sensitive material was developed.

The light-sensitive material was washed with water to remove the image formation accelerating layer and the light-sensitive layer. The hardening layer was etched with the alkaline solution by a brush in an automatic developing machine. The light-sensitive material was well washed with water to form a blue polymer relief image within the exposed area of the hardening layer.

III. Evaluation of printing plate

The obtained relief image was installed as a printing plate in a printing machine (SORM, Heidelberg Co., Ltd.), and the image was printed. The printed image was observed to evaluate the dot reproduction at 1751 pi, and the dot percent of 50% dot was also measured by means of a dot analyzer (DA-5000, Shin-Oji Paper Co., Ltd.).

The top highlight reproduction of 2% dot was observed both before and after printing.

The dot percents of 50% dot measured before and after printing were 50% and 48.5 to 50%, respectively (namely, the variation was 0 to 1.5%).

EXAMPLES 2 TO 5 AND COMPARISON EXAMPLES 1 TO 3

Light-sensitive materials were prepared and evaluated in the same manner as in Example 1, except that the following ethylenically unsaturated polymerizable compounds (b) to (e) and (x) to (z) were used in place of the ethylenically unsaturated polymerizable compound (a). The results are set forth in Table 1.

Ethylenically unsaturated polymerizable compound (b)

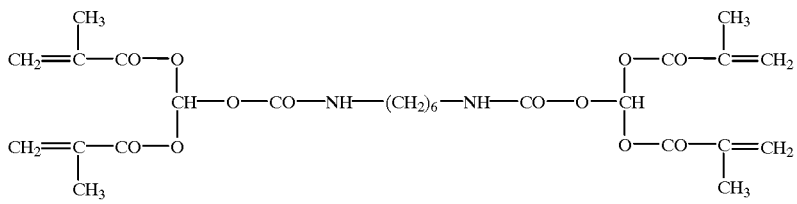

Ethylenically unsaturated polymerizable compound (c)

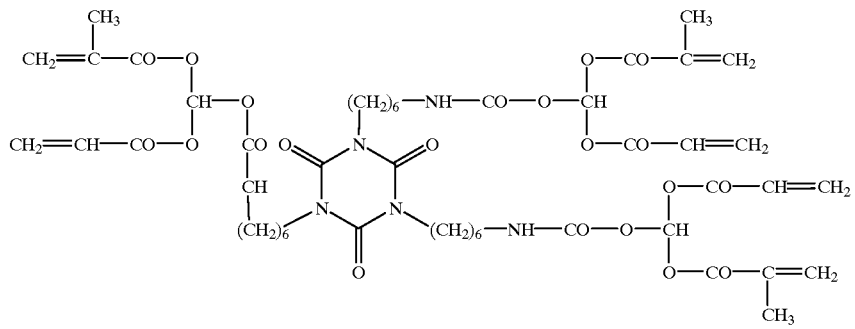

Ethylenically unsaturated polymerizable compound (d)

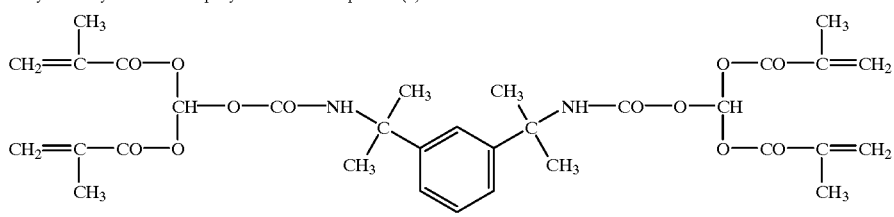

Ethylenically unsaturated polymerizable compound (e)

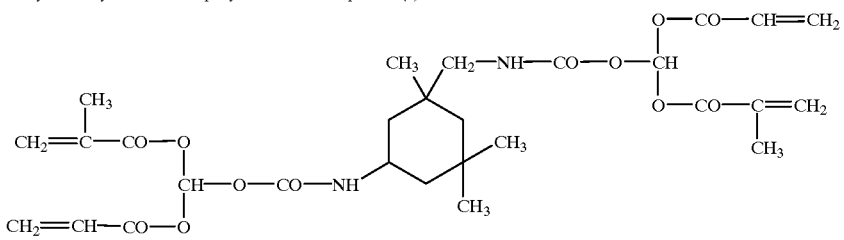

Ethylenically unsaturated polymerizable compound (x)

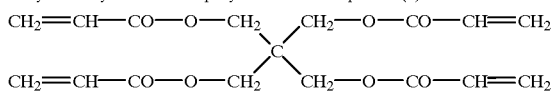

Ethylenically unsaturated polymerizable compound (y)

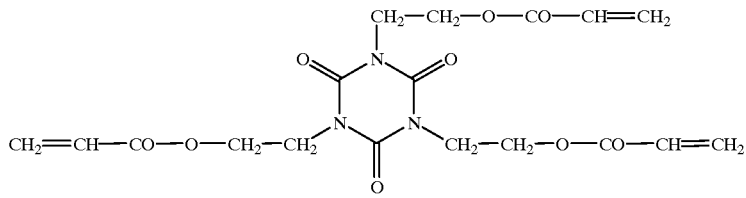

Ethylenically unsaturated polymerizable compound (z)

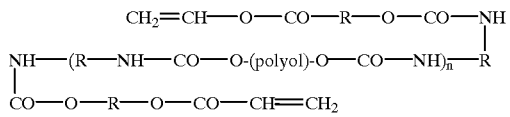

(M-1210, Taogosei Chemical Industry Co., Ltd.)

TABLE 1

| Image forming process | Polymerizable compound | Variation of 50% dots | Top highlight reproduction before printing | Top highlight reproduction After printing |
|---|---|---|---|---|
| Example 1 | (a) | 0–1.5% | 2% | 2% |
| Example 2 | (b) | 0.5–2% | 2% | 2% |
| Example 3 | (c) | 0.5–2% | 2% | 2% |
| Example 4 | (d) | 0.5–2% | 2% | 2% |
| Example 5 | (e) | 0.5–2% | 2% | 2% |
| Comp. Ex. 1 | (x) | 3–6% | 2% | 4% |
| Comp. Ex. 2 | (y) | 3–6% | 2% | 4% |
| Comp. Ex. 3 | (z) | 5–10% | 4% | 10% |

I claim:

1. An image forming process comprising the steps of:

imagewise exposing to light a light-sensitive material which comprises a support, a hardening layer and a light-sensitive layer in this order, said hardening layer containing an ethylenically unsaturated polymerizable compound represented by the formula (I), said light-sensitive layer containing silver halide and a hydrophilic polymer, and said hardening layer or said light-sensitive layer containing a reducing agent:

$$A(-NH-CO-Y-L-Q_n)_m \quad (I)$$

in which A is an m-valent organic group having 1 to 50 carbon atoms; Y is —O— or —NR—, wherein R is hydrogen or an alkyl group having 1 to 12 carbon atoms; L is an (n+1)-valent aliphatic group having 1 to 10 carbon atoms; Q is acryloyloxy or methacryloyloxy; n is 1, 2 or 3; and m is 2, 3, 4, 5 or 6;

heating the light-sensitive material to develop the silver halide within the exposed area and to harden the hardening layer; and removing the light-sensitive layer and the unhardened area of the hardening layer from the light-sensitive material with an etching solution to form a replica image of the hardened area on the support.

2. The image forming process as claimed in claim 1, wherein A is an m-valent aliphatic group having 1 to 20 carbon atoms.

3. The image forming process as claimed in claim 1, wherein A is a combination of an aliphatic group with —O—, —CO—, —N< or —NH—.

4. The image forming process as claimed in claim 1, wherein A is selected from the group consisting of 9:

A-1
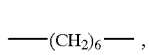

A-2
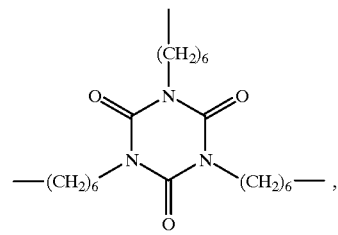

A-3
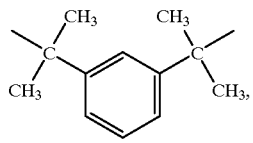

A-4
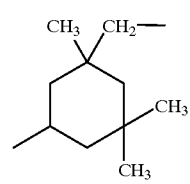

A-5
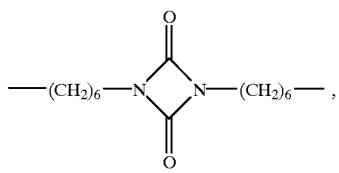

A-6
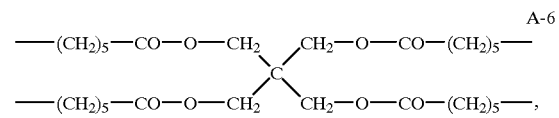

A-7
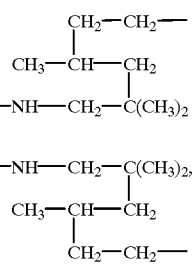

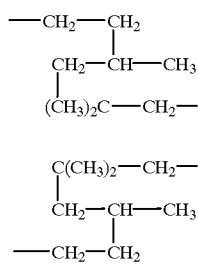

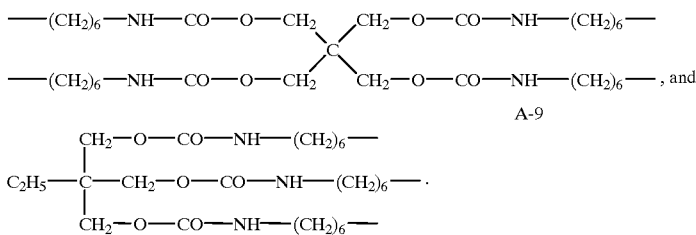

5. The image forming process as claimed in claim 1, wherein Y is —O—.

6. The image forming process as claimed in claim 1, wherein L is selected from the group consisting of:

 L-1

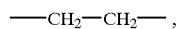 L-2

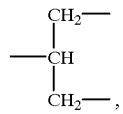 L-3

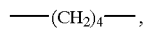 L-4

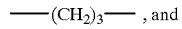 L-5

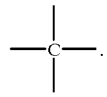 L-6

7. A light-sensitive material which comprises a support, a hardening layer and a light-sensitive layer in this order, said hardening layer containing an ethylenically unsaturated polymerizable compound represented by the formula (I), said light-sensitive layer containing silver halide and a hydrophilic polymer, and said hardening layer or said light-sensitive layer containing a reducing agent:

$$A(\text{—NH—CO—Y—L—Q}_n)_m \quad (I)$$

in which A is an m-valent organic group having 1 to 50 carbon atoms; Y is —O— or —NR—, wherein R is hydrogen or an alkyl group having 1 to 12 carbon atoms; L is an (n+1)-valent aliphatic group having 1 to 10 carbon atoms; Q is acryloyloxy or methacryloyloxy; n is 1, 2 or 3; and m is 2, 3, 4, 5 or 6.

8. The light-sensitive material as claimed in claim 7, wherein A is an m-valent aliphatic group having 1 to 20 carbon atoms.

9. The light-sensitive material as claimed in claim 7, wherein A is a combination of an aliphatic group with —O—, —CO—, —N< or —NH—.

10. The light-sensitive material as claimed in claim 7, wherein A is selected from the group consisting of:

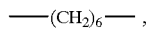 A-1

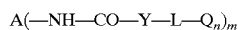 A-2

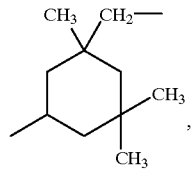 A-3

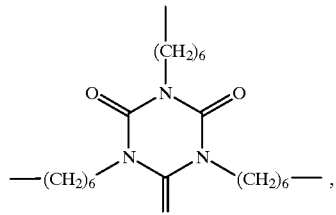 A-4

-continued
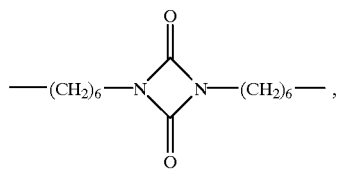
A-5
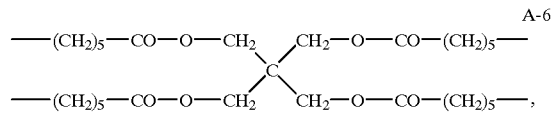
A-6
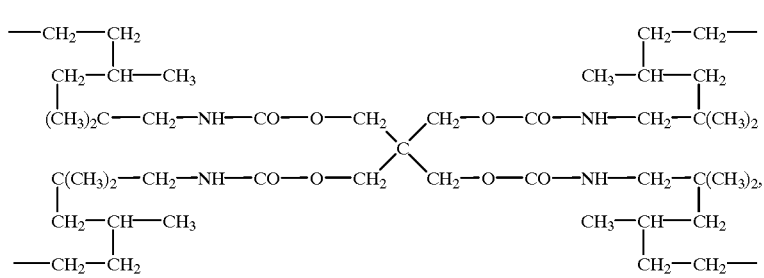
A-7
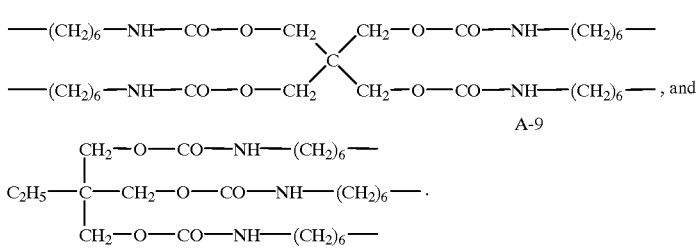
A-8
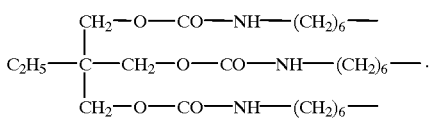
A-9
11. The light-sensitive material as claimed in claim 7, wherein Y is —O—.
12. The light-sensitive material as claimed in claim 7, wherein L is selected from the group consisting of:
L-1
—CH₂—CH₂—,
L-2
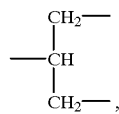
L-3
-continued
—(CH₂)₄—,
L-4
—(CH₂)₃—, and
L-5
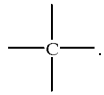
L-6
* * * * *